(12) United States Patent
Hatakeyama et al.

(10) Patent No.: US 11,050,408 B2
(45) Date of Patent: Jun. 29, 2021

(54) ACOUSTIC WAVE DEVICE

(71) Applicant: TAIYO YUDEN CO., LTD., Tokyo (JP)

(72) Inventors: Kazushige Hatakeyama, Tokyo (JP); Naoki Kakita, Tokyo (JP); Takuma Kuroyanagi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/510,568

(22) Filed: Jul. 12, 2019

(65) Prior Publication Data

US 2020/0099361 A1    Mar. 26, 2020

(30) Foreign Application Priority Data

Sep. 26, 2018  (JP) .............................. JP2018-180847

(51) Int. Cl.
| | |
|---|---|
| *H03H 9/25* | (2006.01) |
| *H03H 9/64* | (2006.01) |
| *H03H 9/02* | (2006.01) |
| *H03H 9/145* | (2006.01) |

(52) U.S. Cl.
CPC .......... *H03H 9/25* (2013.01); *H03H 9/02535* (2013.01); *H03H 9/64* (2013.01); *H03H 9/02637* (2013.01); *H03H 9/02834* (2013.01); *H03H 9/145* (2013.01)

(58) Field of Classification Search
CPC ........ H03H 9/25; H03H 9/02535; H03H 9/64; H03H 9/02637; H03H 9/02834; H03H 9/145
See application file for complete search history.

(56) References Cited

U.S. PATENT DOCUMENTS

| | | | |
|---|---|---|---|
| 2006/0151203 A1* | 7/2006 | Krueger | H03H 9/1071 174/260 |
| 2012/0223789 A1* | 9/2012 | Inoue | H03H 3/08 333/193 |
| 2013/0134831 A1 | 5/2013 | Yamashita | 310/313 |
| 2017/0331455 A1 | 11/2017 | Kuroyanagi | |
| 2019/0036510 A1* | 1/2019 | Kikuchi | H01L 23/34 |

FOREIGN PATENT DOCUMENTS

| | | |
|---|---|---|
| JP | 2007-67617 A | 3/2007 |
| JP | 2013-115664 A | 6/2013 |
| JP | 2017-204827 A | 11/2017 |

* cited by examiner

*Primary Examiner* — Samuel S Outten
(74) *Attorney, Agent, or Firm* — Stein IP, LLC

(57) ABSTRACT

An acoustic wave device includes: a first substrate that has a first surface and a second surface, the second surface being an opposite surface of the first substrate from the first surface; an acoustic wave element that is located on the first surface; a wiring portion that electrically connects the acoustic wave element and a metal portion through a through hole, the metal portion being located on the second surface, the through hole penetrating through the first substrate; and a sealing portion that is located on the first surface so as to surround the acoustic wave element, overlaps with at least a part of the through hole in plan view, and seals the acoustic wave element in an air gap.

8 Claims, 13 Drawing Sheets

ACOUSTIC WAVE DEVICE

CROSS-REFERENCE TO RELATED APPLICATION

This application is based upon and claims the benefit of priority of the prior Japanese Patent Application No. 2018-180847, filed on Sep. 26, 2018, the entire contents of which are incorporated herein by reference.

FIELD

A certain aspect of the present invention relates to an acoustic wave device.

BACKGROUND

There has been known a method of sealing an acoustic wave element by providing a sealing portion on the upper surface, on which the acoustic wave element is located, of a substrate so that the sealing portion surrounds the acoustic wave element as disclosed in, for example, Japanese Patent Application Publication Nos. 2007-067617, 2017-204827, and 2013-115664 (hereinafter, referred to as Patent Documents 1 through 3, respectively). It has been known to electrically connect the acoustic wave element and the lower surface of the substrate through a penetrating electrode penetrating through the substrate as disclosed in, for example, Patent Documents 1 and 2.

SUMMARY

According to an aspect of the present invention, there is provided an acoustic wave device including: a first substrate that has a first surface and a second surface, the second surface being an opposite surface of the first substrate from the first surface; an acoustic wave element that is located on the first surface; a wiring portion that electrically connects the acoustic wave element and a metal portion through a through hole, the metal portion being located on the second surface, the through hole penetrating through the first substrate; and a sealing portion that is located on the first surface so as to surround the acoustic wave element, overlaps with at least a part of the through hole in plan view, and seals the acoustic wave element in an air gap.

DETAILED DESCRIPTION

When an acoustic wave element and the lower surface of a substrate are electrically connected through a through hole penetrating through the substrate, the size of the acoustic wave device increases.

Hereinafter, a description will be given of embodiments of the present disclosure with reference to the accompanying drawings.

First Embodiment

Figure 1A:
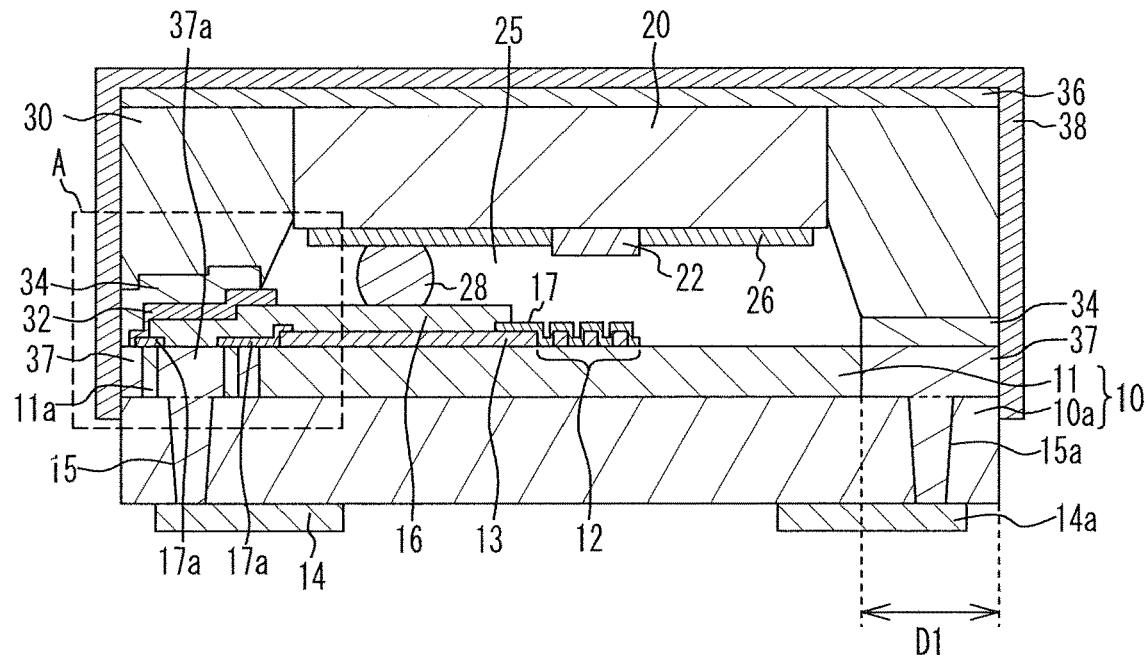
FIG. 1A is a cross-sectional view of an acoustic wave device in accordance with a first embodiment.
Figure 1B:
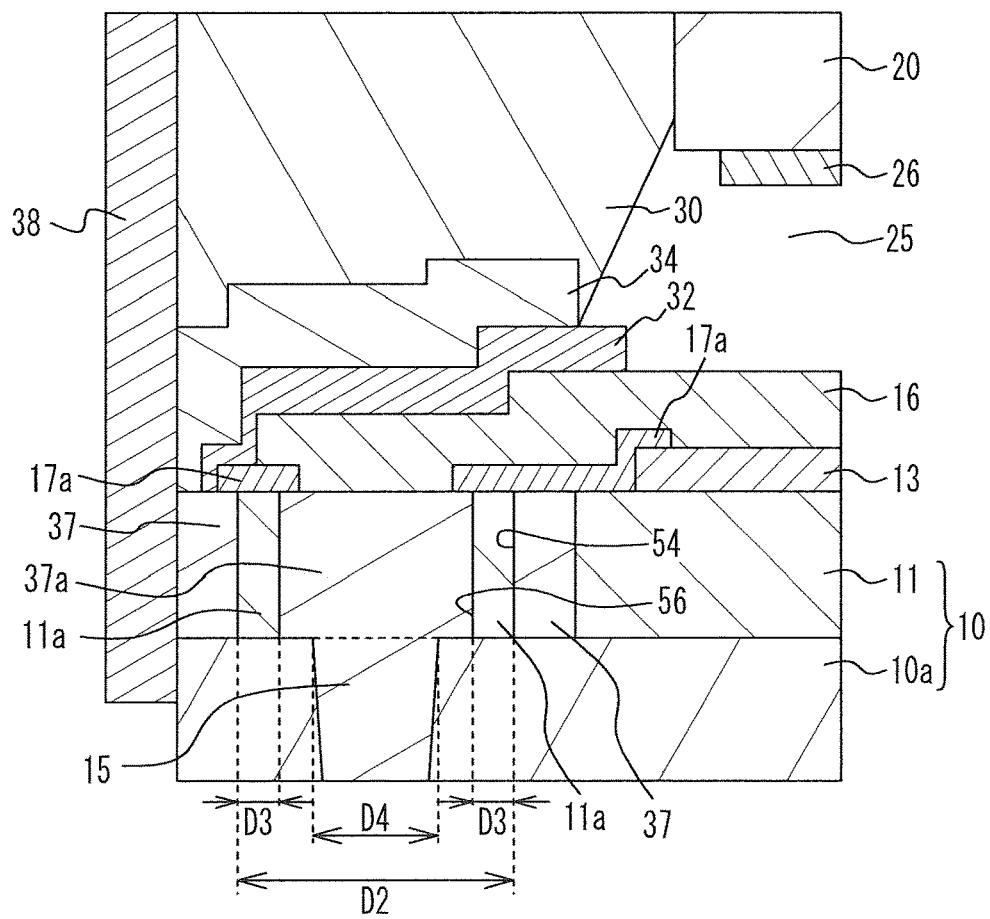
FIG. 1B is an enlarged view of a part A in FIG. 1A.

FIG. 1A is a cross-sectional view of an acoustic wave device in accordance with a first embodiment, and FIG. 1B is an enlarged view of a part A in FIG. 1A. As illustrated in FIG. 1A and FIG. 1B, a substrate 10 has a support substrate 10a and a piezoelectric substrate 11. The piezoelectric substrate 11 is bonded on the upper surface of the support substrate 10a. The support substrate 10a is, for example, a sapphire substrate, an alumina substrate, a spinel substrate, a quartz substrate, a crystal substrate, or a silicon substrate, and is a monocrystalline substrate, a polycrystalline substrate, or a sintered body substrate. The piezoelectric substrate 11 is, for example, a lithium tantalate substrate or a lithium niobate substrate, and is a monocrystalline substrate. The piezoelectric substrate 11 has a thickness of, for example, 0.5 μm to 30 μm.

Terminals 14 and 14a are located on the lower surface of the substrate 10. The terminals 14 and 14a are formed of a metal layer such as, but not limited to, a gold layer or a copper layer. Acoustic wave resonators 12 and wiring lines 13 are located on the upper surface of the substrate 10. The acoustic wave resonators 12 and the wiring lines 13 are electrically connected. Here, "electrically connected" means that two points are connected as a designed alternate current circuit. Unintended electromagnetic coupling and unintended electrostatic coupling in the alternate current circuit are not included in "electrically connected". The wiring lines 13 are formed of a metal layer such as, but not limited to, an aluminum layer or a copper layer. The piezoelectric substrate 11 in the periphery of the upper surface of the support substrate 10a is removed. A ring-shaped metal layer 37 is located in the region where the piezoelectric substrate 11 is removed. The width D1 of the ring-shaped metal layer 37 is, for example, 50 μm to 200 μm.

An aperture 54 is formed in the ring-shaped metal layer 37, and a piezoelectric substrate 11a is located in the aperture 54. The aperture 54 has, for example, a diameter D2 of 10 μm to 100 μm. An aperture 56 is formed in the piezoelectric substrate 11a, and a metal layer 37a is located in the aperture 56. The piezoelectric substrate 11a has a width D3 of, for example, 5 μm to 50 μm. The ring-shaped metal layer 37 and the metal layer 37a are insulated from each other by the piezoelectric substrate 11a. The piezoelectric substrates 11 and 11a are made of the same material. The piezoelectric substrate 11a and the piezoelectric substrate 11 may be insulating layers made of different materials. The insulating layer has a thickness of, for example, 5 μm to 50 μm.

The ring-shaped metal layer 37 and the metal layer 37a are a metal layer such as, but not limited to, a copper layer, a gold layer, a silver layer, a tungsten layer, a nickel layer, or a molybdenum layer. Penetrating electrodes 15 and 15a penetrate through the support substrate 10a. The penetrating electrode 15 electrically connects the terminal 14 and the metal layer 37a. The penetrating electrode 15a electrically connects the terminal 14a and the ring-shaped metal layer 37. The penetrating electrodes 15 and 15a are formed of a metal layer such as, but not limited to, a copper layer, a gold layer, a silver layer, or a tungsten layer. The penetrating electrodes 15 and 15a have, for example, a diameter D4 of 10 μm to 80 μm.

An insulating film 17 is located, as a protective film for the acoustic wave resonator 12, on the acoustic wave resonator 12. An insulating film 17a is located on the ring-shaped metal layer 37 between the piezoelectric substrate 11 and the piezoelectric substrate 11a. The insulating films 17 and 17a are, for example, a silicon oxide film, a silicon nitride film, or an aluminum oxide film. The insulating films 17 and 17a have thicknesses of, for example, 0.02 μm to 1 μm. A wiring line 16 is located on the wiring line 13. The wiring line 16 electrically connects the metal layer 37a and the wiring line 13, and is insulated from the ring-shaped metal layer 37 by the insulating film 17a. The wiring line 16 is formed of a metal layer such as, but not limited to, a gold layer, a silver layer, a copper layer, or an aluminum layer. An adhesion layer or a barrier layer such as, but not limited to, a titanium layer may be provided under the gold layer, the silver layer, the copper layer, or the aluminum layer.

An insulating film 32 is located on the wiring line 16. The insulating film 32 is an inorganic insulating film such as, but not limited to, a silicon oxide film, a silicon nitride film, or an aluminum oxide film, or a resin film such as, but not limited to, a polyimide resin film, an epoxy resin film, or a novolak resin film. The insulating film 32 has a thickness of, for example, 0.1 μm to 10 μm. A bonding layer 34 is located on the insulating film 32. The bonding layer 34 is located in the periphery of the support substrate 10a so as to overlap with the ring-shaped metal layer 37. The bonding layer 34 and the metal layer 37a are insulated from each other by the insulating film 32. In the region where none of the metal layer 37a and the piezoelectric substrate 11a is located, the bonding layer 34 is electrically connected to the ring-shaped metal layer 37. The bonding layer 34 includes a metal layer such as, but not limited to, a nickel layer, a tungsten layer, or a molybdenum layer with a film thickness of 0.5 μm to 5 μm, and a gold layer located on the metal layer and having a thickness of 0.03 μm to 0.1 μm. The gold layer is a layer to which solder, which is the sealing portion 30, is bonded, and the nickel layer, the tungsten layer, or the molybdenum layer is a diffusion prevention layer.

Acoustic wave resonators 22 and wiring lines 26 are located on the lower surface of a substrate 20. The substrate 20 is, for example, a silicon substrate, an insulating substrate such as, but not limited to, a glass substrate, or a semiconductor substrate. The wiring lines 26 are formed of a metal layer such as, but not limited to, a copper layer, an aluminum layer, or a gold layer. The substrate 20 is flip-chip mounted (face-down mounted) on the substrate 10 through bumps 28. The bump 28 is a metal bump such as, but not limited to, a gold bump, a solder bump, or a copper bump. The bump 28 bonds the wiring lines 16 and 26.

A sealing portion 30 is located on the substrate 10 so as to surround the substrate 20. The sealing portion 30 is made of a metallic material such as, but not limited to, solder. The sealing portion 30 is bonded to the bonding layer 34. A flat lid 36 is located on the upper surface of the substrate 20 and the upper surface of the sealing portion 30. The lid 36 is, for example, a metal plate or an insulating plate. A protective film 38 is located so as to cover the lid 36 and the sealing portion 30. The protective film 38 is a metal film or an insulating film.

The acoustic wave resonator 12 faces the substrate 20 across an air gap 25, and the acoustic wave resonator 22 faces the substrate 10 across the air gap 25. The air gap 25 is sealed by the sealing portion 30, the substrate 10, the substrate 20, and the lid 36. The bump 28 is surrounded by the air gap 25.

The terminal 14 is electrically connected to the acoustic wave resonator 12 through the penetrating electrode 15, the metal layer 37a, and the wiring lines 16 and 13. Furthermore, the terminal 14 is electrically connected to the acoustic wave resonator 22 through the bump 28 and the wiring line 26. The terminal 14 is insulated from the ring-shaped metal layer 37 and the bonding layer 34 by the insulating films 17a and 32. The terminal 14a is electrically connected to the sealing portion 30 through the penetrating electrode 15a, the ring-shaped metal layer 37, and the bonding layer 34. When a ground potential is supplied to the terminal 14a, the ring-shaped metal layer 37, the bonding layer 34, and the sealing portion 30 have a ground potential, and acts as a shield.

Figure 2A:
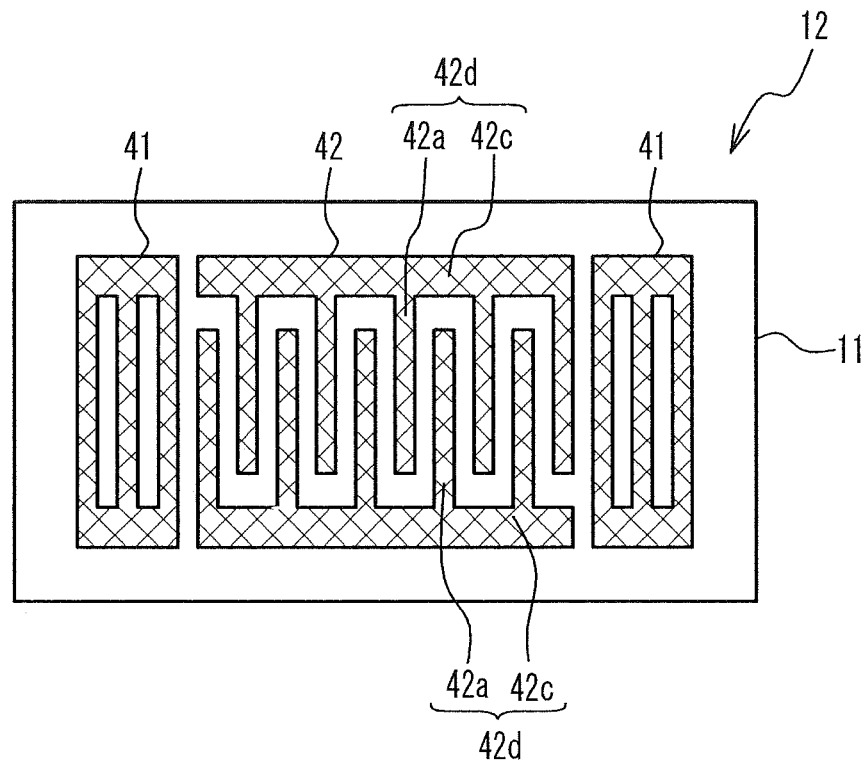
FIG. 2A is a plan view of an acoustic wave resonator 12.
Figure 2B:
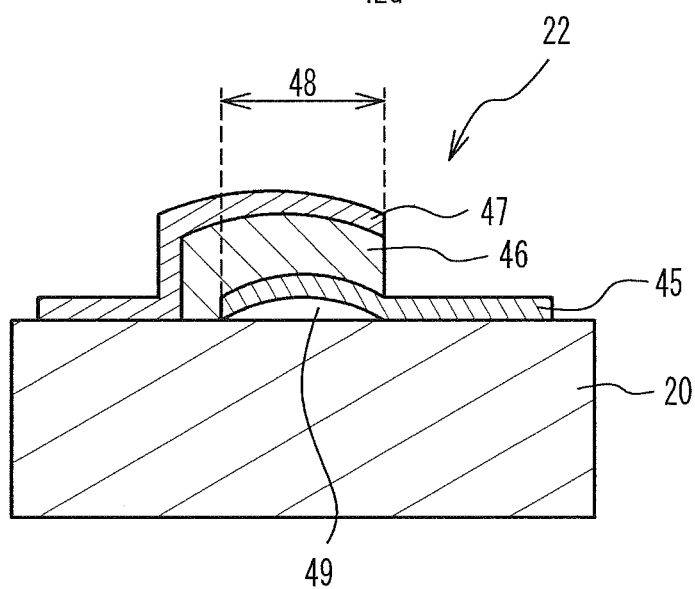
FIG. 2B is a cross-sectional view of an acoustic wave resonator 22.

FIG. 2A is a plan view of the acoustic wave resonator 12, and FIG. 2B is a cross-sectional view of the acoustic wave resonator 22. As illustrated in FIG. 2A, the acoustic wave resonator 12 is a surface acoustic wave resonator. An interdigital transducer (IDT) 42 and reflectors 41 are formed on the piezoelectric substrate 11. The IDT 42 includes a pair of comb-shaped electrodes 42d facing each other. The comb-shaped electrode 42d has a plurality of electrode fingers 42a and a bus bar 42c connecting the electrode fingers 42a. The reflectors 41 are located at both sides of the IDT 42. The IDT 42 excites a surface acoustic wave on the piezoelectric substrate 11. An insulating film such as, but not limited to, a silicon oxide film acting as a temperature compensation film may be provided on the IDT 42 and the reflectors 41.

As illustrated in FIG. 2B, the acoustic wave resonator 22 is a piezoelectric thin film resonator. A piezoelectric film 46 is located on the substrate 20. A lower electrode 45 and an upper electrode 47 face each other across the piezoelectric film 46. An air gap 49 is formed between the lower electrode 45 and the substrate 20. The region where the lower electrode 45 and the upper electrode 47 face each other across the piezoelectric film 46 is a resonance region 48 that excites an acoustic wave in the thickness extension mode. The lower electrode 45 and the upper electrode 47 are formed of a metal film such as, but not limited to, a ruthenium film, and the piezoelectric film 46 is, for example, an aluminum nitride film. The acoustic wave resonator 22 may be a surface acoustic wave resonator such as the surface acoustic wave resonator illustrated in FIG. 2A.

Figure 3:
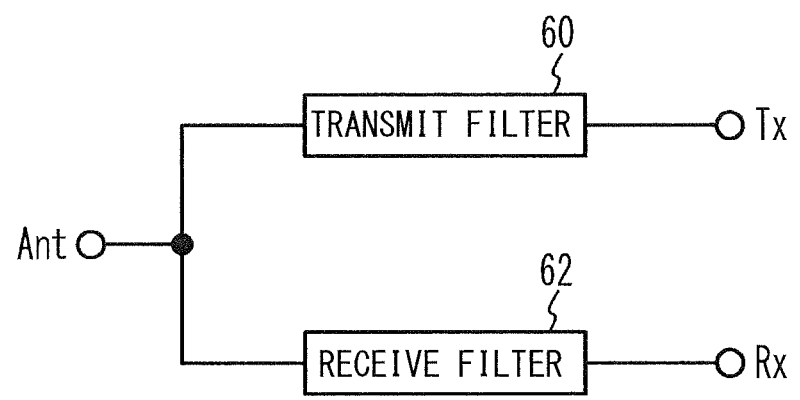
FIG. 3 is a circuit diagram of the acoustic wave device in accordance with the first embodiment.

FIG. 3 is a circuit diagram of the acoustic wave device in accordance with the first embodiment. The acoustic wave device is a duplexer, and a transmit filter 60 is connected between a common terminal Ant and a transmit terminal Tx. A receive filter 62 is connected between the common terminal Ant and a receive terminal Rx. The common terminal Ant, the transmit terminal Tx, the receive terminal Rx, and a ground terminal are individually formed of the terminals 14 in FIG. 1A. The passband of the transmit filter 60 and the passband of the receive filter 62 do not overlap. The transmit filter 60 transmits signals in the transmit band to the common terminal Ant among high-frequency signals input to the transmit terminal Tx, and suppresses signals in other bands. The receive filter 62 transmits signals in the receive band to the receive terminal Rx among high-frequency signals input to the common terminal Ant, and suppresses signals in other bands.

Figure 4B:
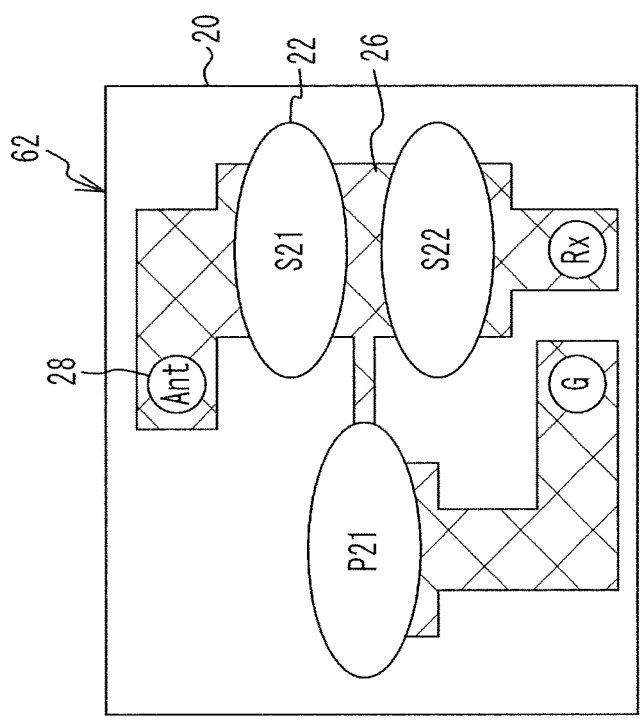
FIG. 4A and FIG. 4B are plan views of substrates in the first embodiment.
Figure 4A:
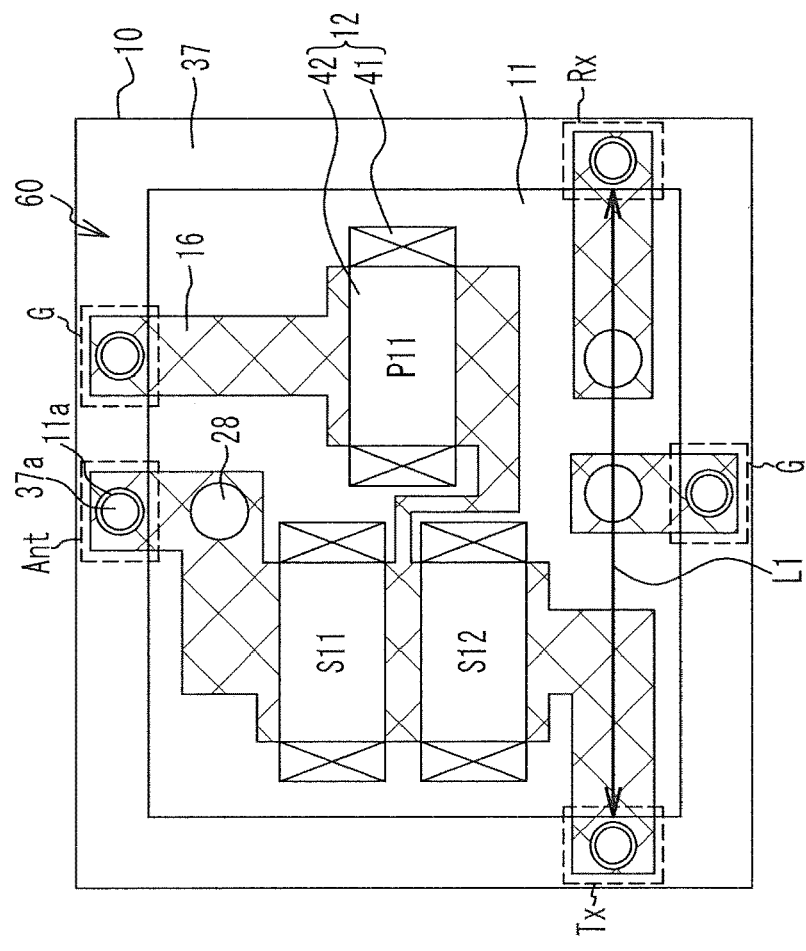

FIG. 4A and FIG. 4B are plan views of the substrates in the first embodiment. FIG. 4A is a plan view of the substrate 10, and the common terminal Ant, the transmit terminal Tx, the receive terminal Rx, and the ground terminal G located on the lower surface of the substrate 10 are indicated by dashed lines. FIG. 4B is a plan view of the substrate 20 as transparently viewed from above. As illustrated in FIG. 4A, a plurality of the acoustic wave resonators 12, the wiring lines 16, and the ring-shaped metal layer 37 are located on the substrate 10. The acoustic wave resonator 12 includes series resonators S11 and S12 and a parallel resonator P11. The bumps 28 are located on the wiring lines 16. The ring-shaped metal layer 37 is located in the periphery of the substrate 10 so as to surround the acoustic wave resonators 12.

The piezoelectric substrate 11a is located in the ring-shaped metal layer 37, and the metal layer 37a is located in the piezoelectric substrate 11a. The wiring lines 16 connect between the acoustic wave resonators 12, connect the acoustic wave resonator 12 and the bump 28, and connect the acoustic wave resonator 12 and the metal layer 37a. A plurality of the metal layers 37a are coupled, through the penetrating electrodes 15, to the common terminal Ant, the transmit terminal Tx, the receive terminal Rx, and the ground terminal G located on the lower surface of the substrate 10. The series resonators S11 and S12 are connected in series between the common terminal Ant and the transmit terminal Tx. The parallel resonator P11 is connected in parallel between the common terminal Ant and the transmit terminal Tx. The parallel resonator P11 is coupled to the ground terminal G. The series resonators S11 and S12 and the parallel resonator P11 form the transmit filter 60.

As illustrated in FIG. 4B, a plurality of the acoustic wave resonators 22 and the wiring lines 26 are located on the substrate 20 (the lower surface in FIG. 1A). The acoustic wave resonators 22 include series resonators S21 and S22 and a parallel resonator P21. The wiring lines 26 connect between the acoustic wave resonators 22, and connect the acoustic wave resonator 22 and the bump 28. The bump 28 is bonded to the wiring line 26. A plurality of the bumps 28 are connected to the common terminal Ant, the receive terminal Rx, and the ground terminal G. The series resonators S21 and S22 are connected in series between the common terminal Ant and the receive terminal Rx. The parallel resonator P21 is connected in parallel between the common terminal Ant and the receive terminal Rx. The parallel resonator P21 is coupled to the ground terminal G. The series resonators S21 and S22 and the parallel resonator P21 form the receive filter 62.

The number of series resonators and the number of parallel resonators in each of the transmit filter 60 and the receive filter 62 can be freely selected.

FIG. 5A through FIG. 6D are cross-sectional views illustrating a method of fabricating the acoustic wave device in accordance with the first embodiment. FIG. 7A through FIG. 8C are plan views of the acoustic wave device in accordance with the first embodiment.

Figure 5A:
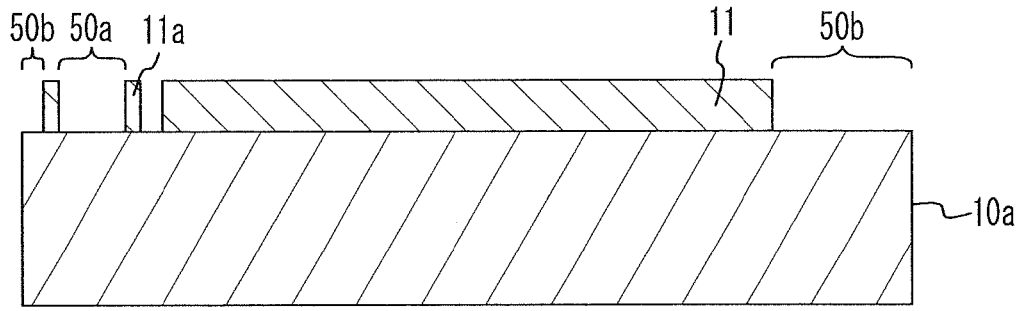
FIG. 5A through FIG. 5D are cross-sectional views (No. 1) illustrating a method of fabricating the acoustic wave device in accordance with the first embodiment.
Figure 7A:
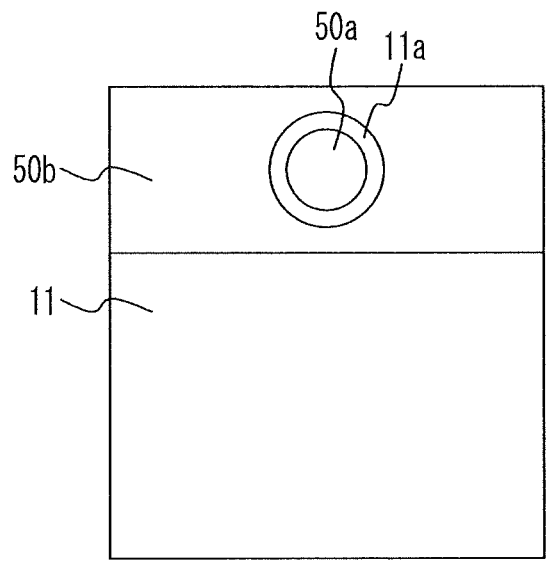
FIG. 7A through FIG. 7D are plan views (No. 1) of the acoustic wave device in accordance with the first embodiment.

As illustrated in FIG. 5A and FIG. 7A, the piezoelectric substrate 11 is bonded to the upper surface of the support substrate 10a. The piezoelectric substrate 11 is bonded by, for example, surface activated bonding. In the surface activated bonding, the upper surface of the support substrate 10a and the lower surface of the piezoelectric substrate 11 are activated with use of an ion beam, a neutralized beam, or plasma. Thereafter, the upper surface of the support substrate 10a and the lower surface of the piezoelectric substrate 11 are bonded. Through this process, the support substrate 10a and the piezoelectric substrate 11 are directly bonded. An amorphous layer with a thickness of 10 nm or less is formed between the support substrate 10a and the piezoelectric substrate 11. The amorphous layer is very thin compared with the piezoelectric substrate 11. Thus, the support substrate 10a and the piezoelectric substrate 11 are practically directly bonded.

The piezoelectric substrate 11 in regions 50a and 50b is removed. The region 50b is a peripheral region of the support substrate 10a. The piezoelectric substrate 11a is left in a ring shape in the region 50b. The region 50a is located in the piezoelectric substrate 11a. The piezoelectric substrate 11 is removed by, for example, sandblasting, wet etching, or dry etching using a patterned photoresist as a mask layer. The mask layer may not necessarily be used, and a laser ablation method may be used.

Figure 5B:
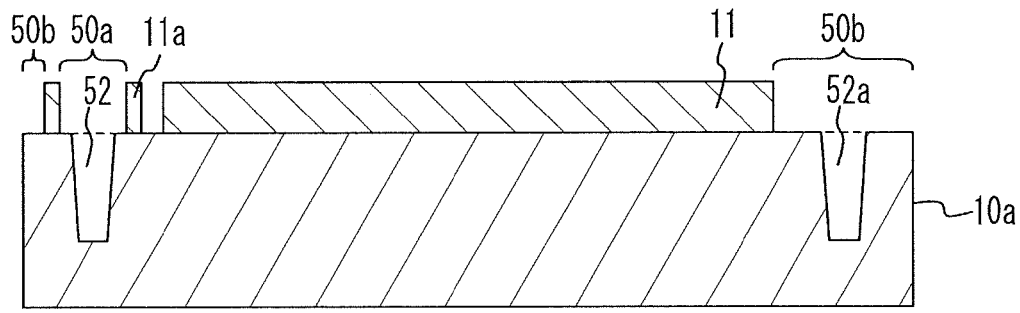
Figure 7B:
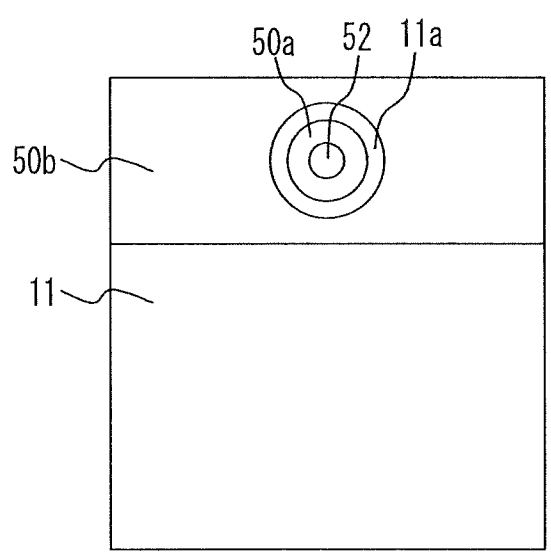

As illustrated in FIG. 5B and FIG. 7B, a hole 52 is formed in the support substrate 10a in the region 50a. A hole 52a is formed in the support substrate 10a in the region 50b. The holes 52 and 52a are formed by, for example, laser ablation or dry etching.

Figure 5C:
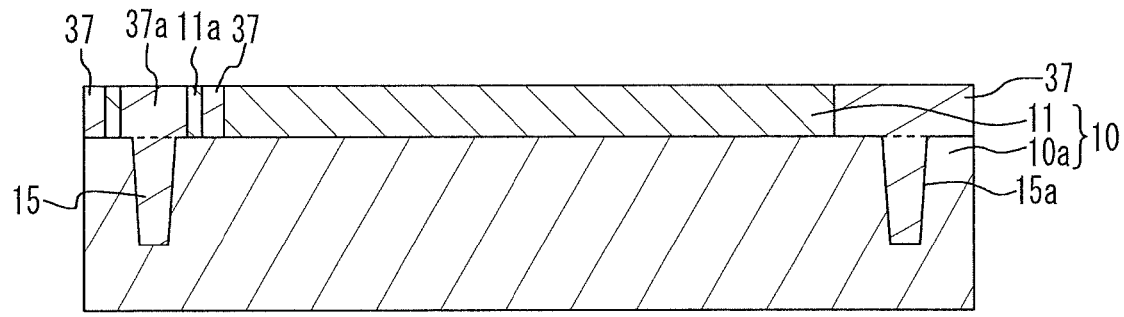
Figure 7C:
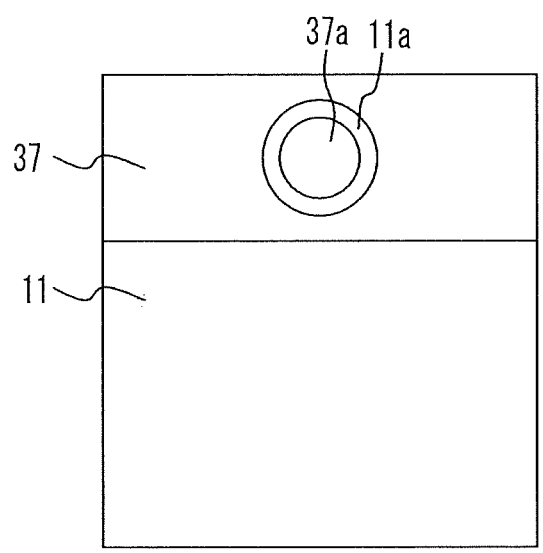

As illustrated in FIG. 5C and FIG. 7C, the regions 50a and 50b and the holes 52 and 52a are filled with a conductive material. This process forms the penetrating electrode 15 in the hole 52, the penetrating electrode 15a in the hole 52a, the metal layer 37a in the region 50a, and the ring-shaped metal layer 37 in the region 50b. Filling of the conductive material is conducted by, for example, electrolytic plating, electroless plating, vacuum printing, sputtering, vacuum evaporation, or chemical vapor deposition (CVD).

Figure 5D:
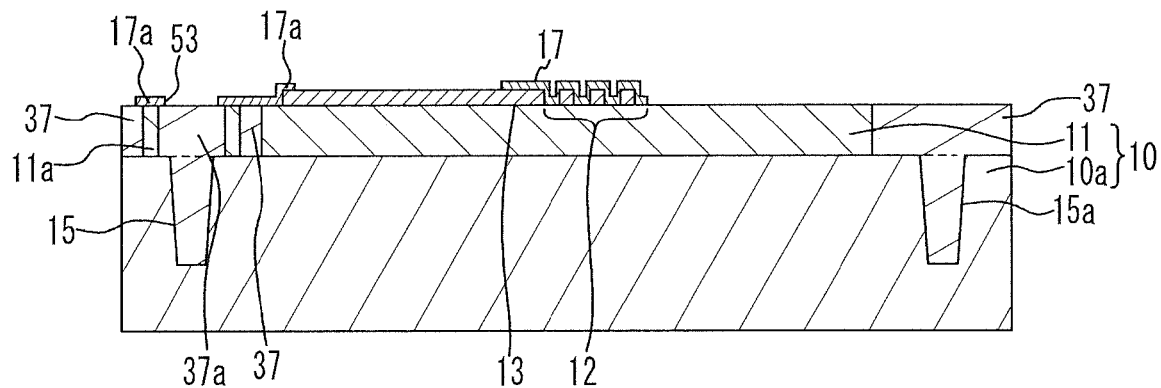
Figure 7D:
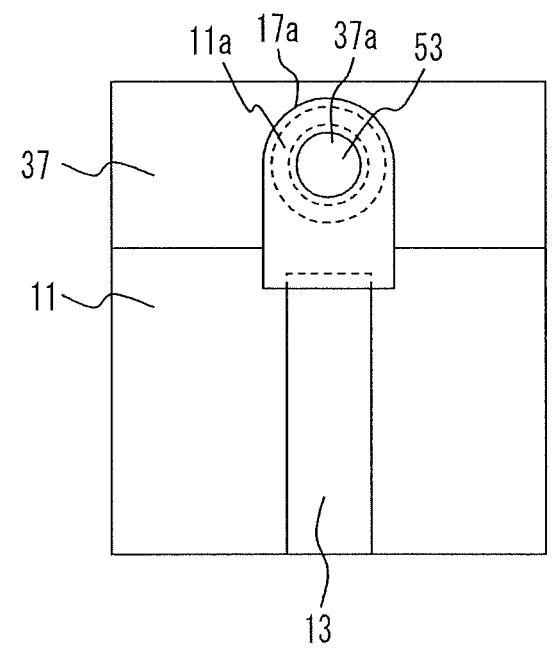

As illustrated in FIG. 5D and FIG. 7D, the acoustic wave resonator 12 having an IDT and reflectors and the wiring line 13 are formed on the piezoelectric substrate 11. The insulating film 17 is formed on the acoustic wave resonator 12, and the insulating film 17a is formed on the ring-shaped metal layer 37 in the vicinity of the piezoelectric substrate 11a. The insulating films 17 and 17a are formed by, for example, sputtering, vacuum evaporation, or CVD, and are then patterned by etching. When the thicknesses of the insulating films 17 and 17a are made to be different, the insulating films 17 and 17a may be separately formed. An aperture 53 that exposes the upper surface of the metal layer 37a is formed in the insulating film 17a.

Figure 6A:
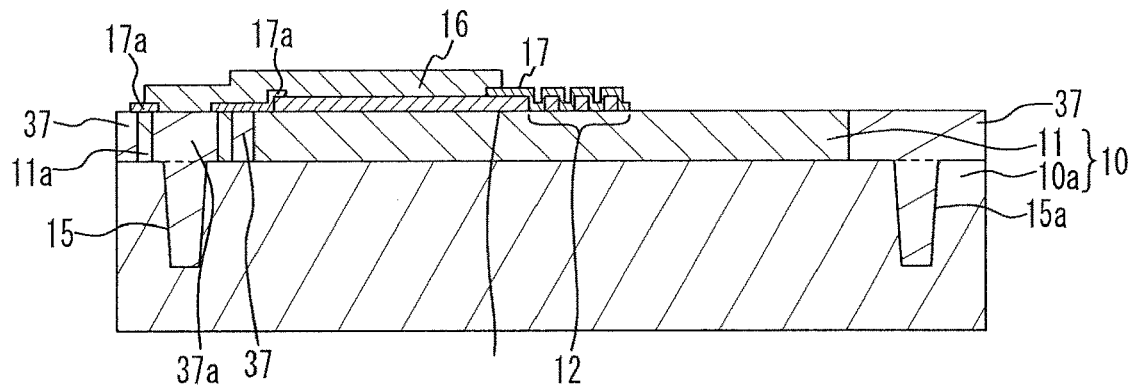
FIG. 6A through FIG. 6D are cross-sectional views (No. 2) illustrating the method of fabricating the acoustic wave device in accordance with the first embodiment.
Figure 8A:
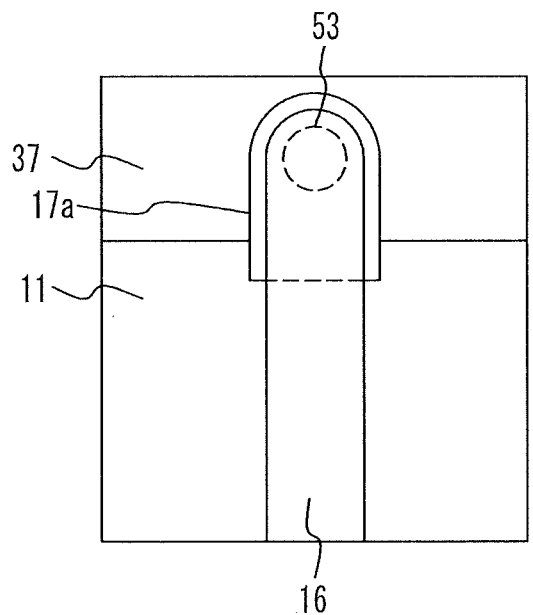
FIG. 8A through FIG. 8C are plan views (No. 2) of the acoustic wave device in accordance with the first embodiment.

As illustrated in FIG. 6A and FIG. 8A, the wiring line 16 is formed on the insulating film 17a. The wiring line 16 is electrically connected to the metal layer 37a through the aperture 53, and is insulated from the ring-shaped metal layer 37. The wiring line 16 is formed by, for example, vacuum evaporation or sputtering, and is then patterned by etching or liftoff.

Figure 6B:
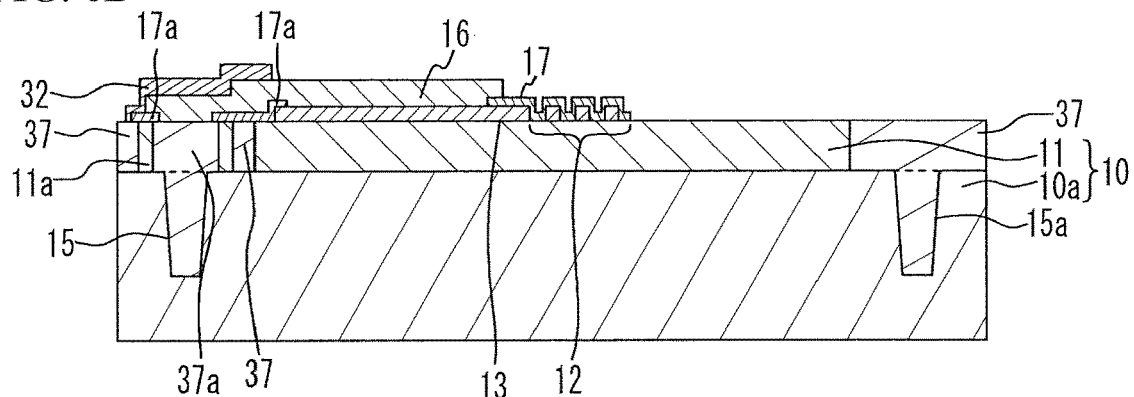
Figure 8B:
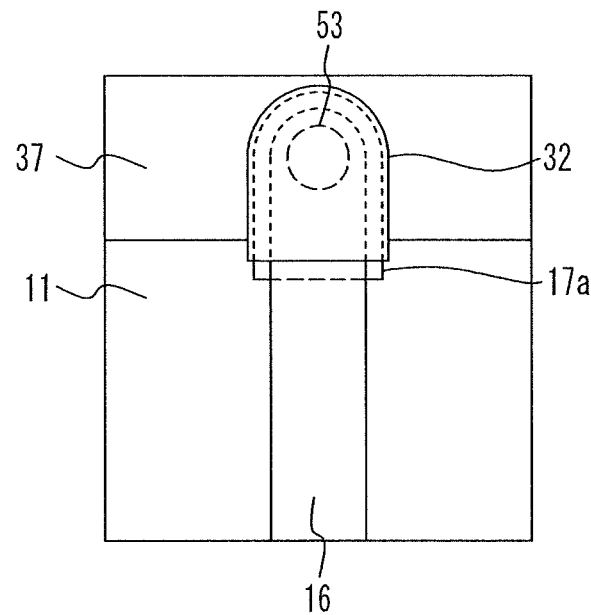

As illustrated in FIG. 6B and FIG. 8B, the insulating film 32 is formed on the wiring line 16. The insulating film 32 is formed by, for example, sputtering, vacuum evaporation, or CVD, and is then patterned by etching. When the insulating film 32 is made of resin, a photosensitive resin may be applied, and then patterned by exposure and development.

Figure 6C:
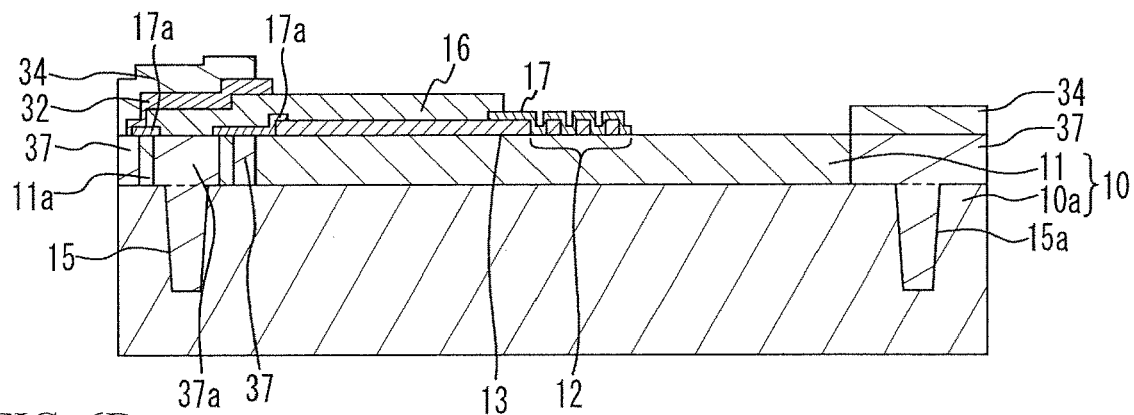
Figure 8C:
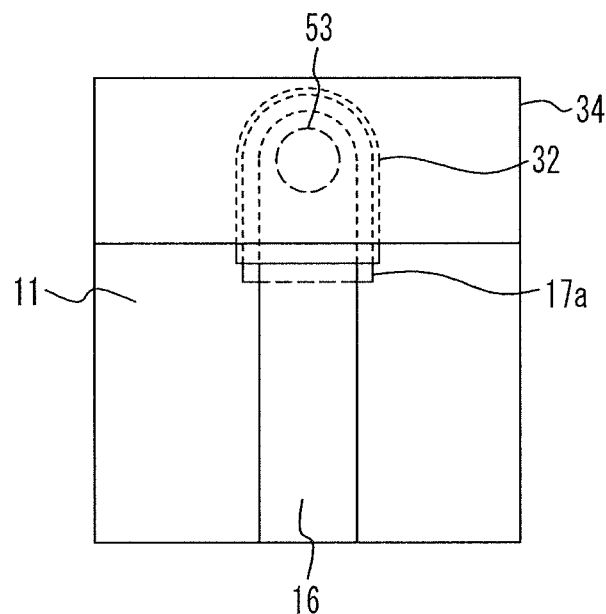

As illustrated in FIG. 6C and FIG. 8C, the bonding layer 34 is formed on the insulating film 32 and the ring-shaped metal layer 37. The bonding layer 34 is electrically connected to the ring-shaped metal layer 37, and is insulated from the wiring line 16 through the insulating film 32. The bonding layer 34 is formed by, for example, vacuum evaporation or sputtering, and is then patterned by etching or liftoff. The bonding layer 34 may be formed by electrolytic plating or electroless plating.

Figure 6D:
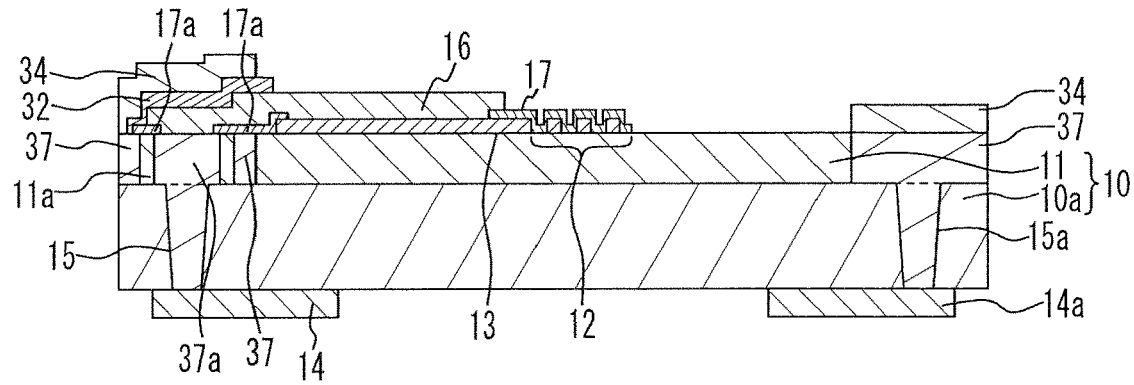

As illustrated in FIG. 6D, the lower surface of the support substrate 10a is polished or ground. This process exposes the penetrating electrodes 15 and 15a. The terminals 14 and 14a respectively electrically connected to the penetrating electrodes 15 and 15a are formed on the lower surface of the support substrate 10a. Thereafter, the substrate 20 is flip-chip mounted with use of the bumps 28. The sealing portion 30 and the lid 36 are formed. The acoustic wave devices are separated into individual acoustic wave devices, and then the protective film 38 is formed by plating.

First Variation of the First Embodiment

Figure 9:
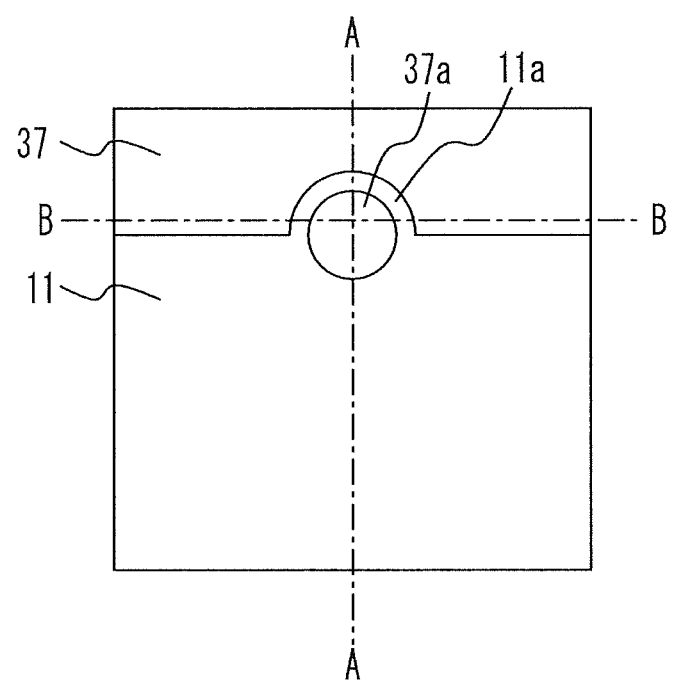
FIG. 9 is a plan view of the vicinity of a penetrating electrode of an acoustic wave device in accordance with a first variation of the first embodiment.
Figure 10A:
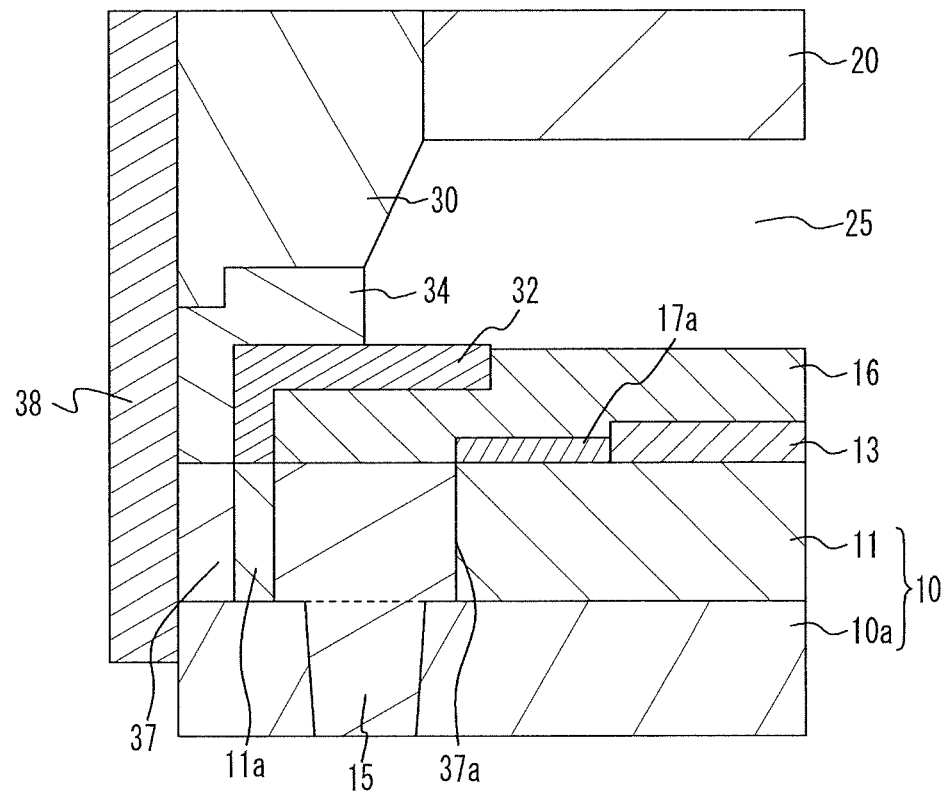
FIG. 10A is a cross-sectional view taken along line A-A in FIG. 9.
Figure 10B:
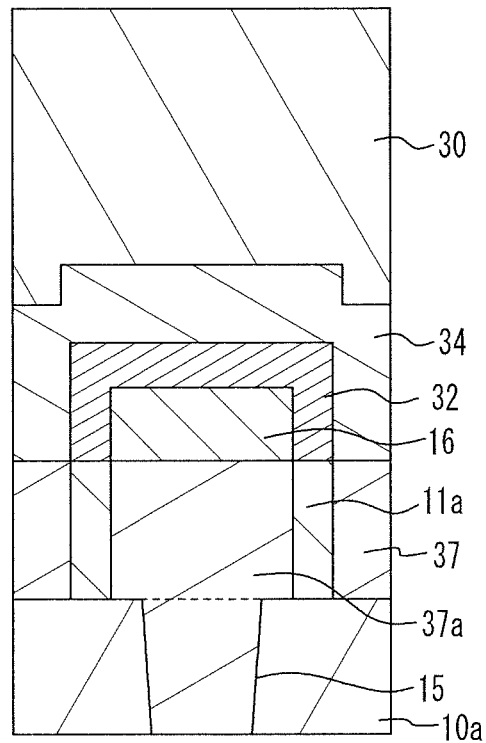
FIG. 10B is a cross-sectional view taken along line B-B in FIG. 9.

FIG. 9 is a plan view of the vicinity of a penetrating electrode of an acoustic wave device in accordance with a first variation of the first embodiment, FIG. 10A is a cross-sectional view taken along line A-A in FIG. 9, and FIG. 10B is a cross-sectional view taken along line B-B in FIG. 9. As illustrated in FIG. 9 through FIG. 10B, the metal layer 37a is located further in than the metal layer 37a of the first embodiment. The piezoelectric substrate 11a is coupled to the piezoelectric substrate 11. Neither the ring-shaped metal layer 37 nor the piezoelectric substrate 11a is located between the metal layer 37a and the piezoelectric substrate 11. Other structures are the same as those of the first embodiment, and the description thereof is thus omitted. As in the first variation of the first embodiment, it is sufficient if at least a part of the metal layer 37a and/or at least a part of the penetrating electrode 15 overlaps with the region where the sealing portion 30 is bonded to the bonding layer 34.

Second Variation of the First Embodiment

Figure 11:
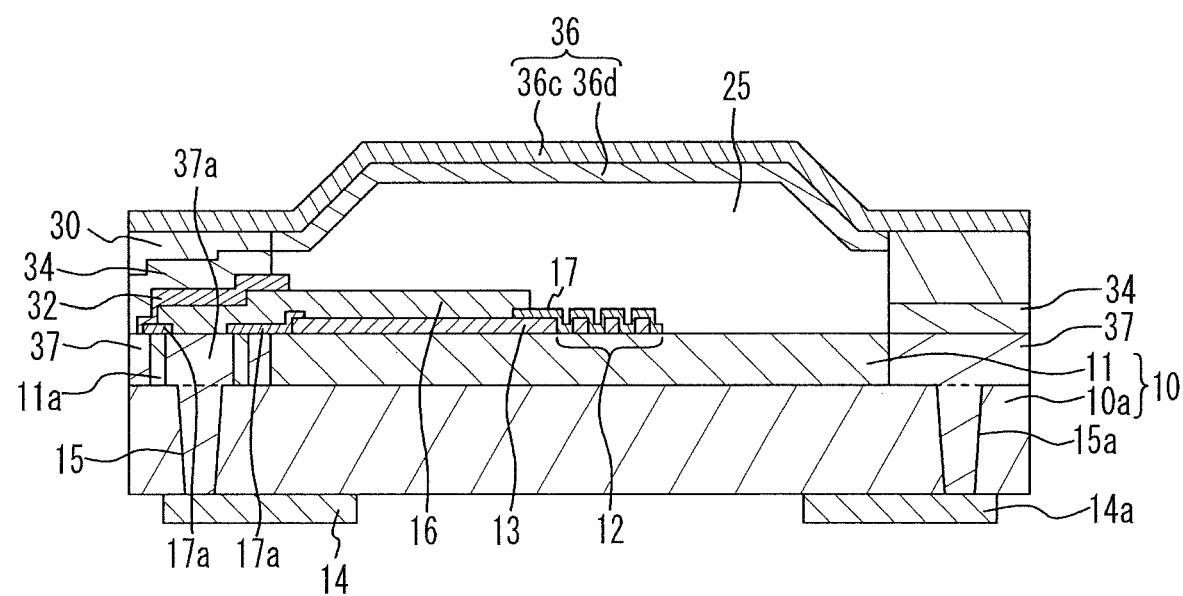
FIG. 11 is a cross-sectional view of an acoustic wave device in accordance with a second variation of the first embodiment.

FIG. 11 is a cross-sectional view of an acoustic wave device in accordance with a second variation of the first embodiment. As illustrated in FIG. 11, the substrate 20 is not provided. The lid 36 is not a flat plate, and the peripheral portion is positioned lower than the center portion. No protective film 38 is provided. The lid 36 includes a metal plate 36c and an insulating film 36d located on the lower surface of the metal plate 36c. The metal plate 36c is, for example, a kovar plate or an iron-nickel alloy plate. The insulating film 36d is, for example, a silicon oxide film.

The insulating film 36d is formed on the lower surface of the metal plate 36c. The insulating film 36d in the periphery of the metal plate 36c is removed. Other structures and other steps of the fabrication method are the same as those of the first embodiment, and the description thereof is thus omitted. As in the second variation of the first embodiment, the substrate 20 may not be necessarily provided.

Third Variation of the First Embodiment

Figure 12:
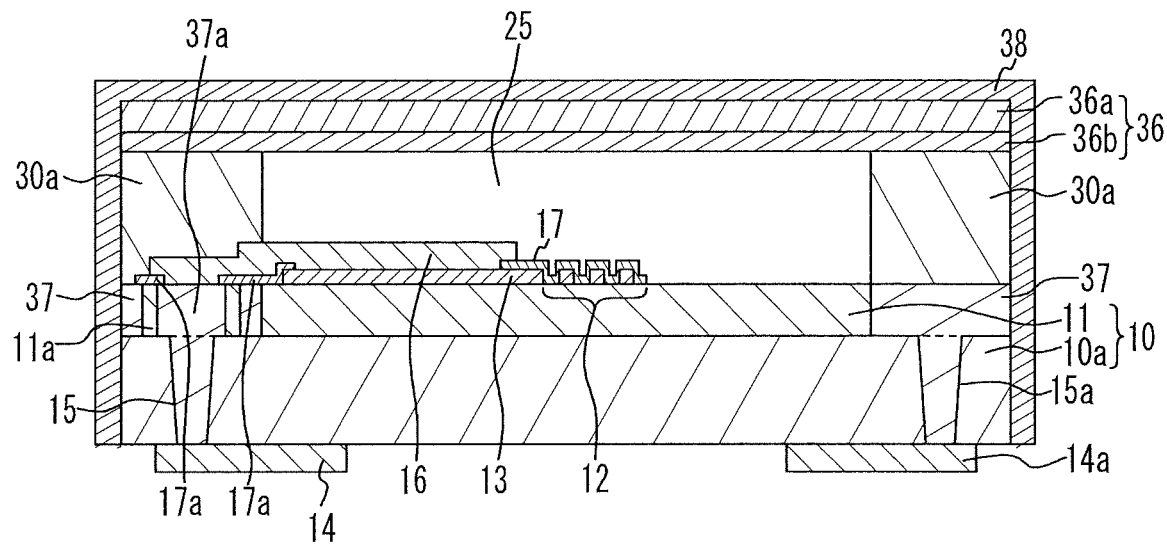
FIG. 12 is a cross-sectional view of an acoustic wave device in accordance with a third variation of the first embodiment.

FIG. 12 is a cross-sectional view of an acoustic wave device in accordance with a third variation of the first embodiment. As illustrated in FIG. 12, the substrate 20 is not provided. A sealing portion 30a is made of resin. Neither the insulating film 32 nor the bonding layer 34 is located on the wiring line 16. The lid 36 includes an insulating plate 36a and a conductive film 36b located on the lower surface of the insulating plate 36a. The insulating plate 36a is, for example, a sapphire substrate, an alumina substrate, a lithium tantalate substrate, a lithium niobate substrate, or a silicon substrate. The conductive film 36b is an adhesion film such as, but not limited to, a titanium film.

The conductive film 36b is formed on the lower surface of the insulating plate 36a by, for example, sputtering. Resin to be the sealing portion 30a is formed on the lower surface of the lid 36. The resin is formed by, for example, applying a photosensitive resin and then exposing and developing the photosensitive resin. After temporary baking, the sealing portion 30a is attached onto the substrate 10, and is then baked. Thereafter, a nickel film is formed as the protective film 38 by sputtering. Other structures and other steps of the fabrication method are the same as those of the first embodiment, and the description thereof is thus omitted.

As in the third variation of the first embodiment, the sealing portion 30a may be made of resin. Since the sealing portion 30a is made of resin, the bonding layer 34 may be omitted. In addition, since the sealing portion 30a is made of an insulating material, the insulating film 32 may be omitted. When the substrate 20 is provided as in the first embodiment, the sealing portion may be made of resin.

First Comparative Example

Figure 13A:
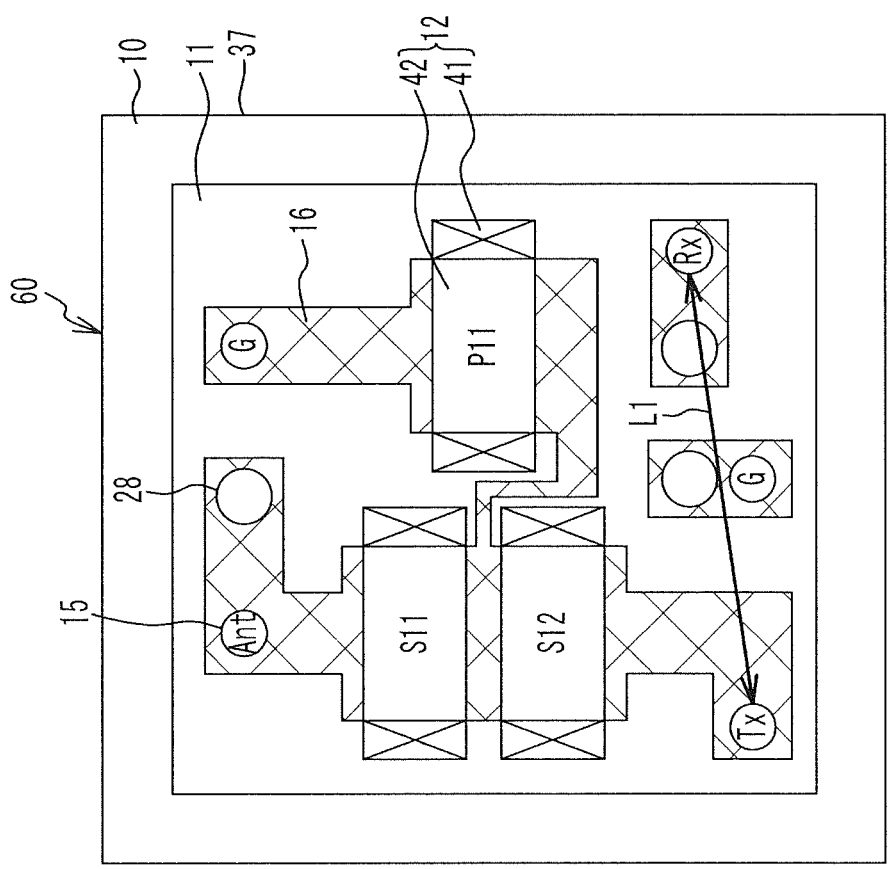
FIG. 13A and FIG. 13B are plan views of substrates in a first comparative example.
Figure 13B:
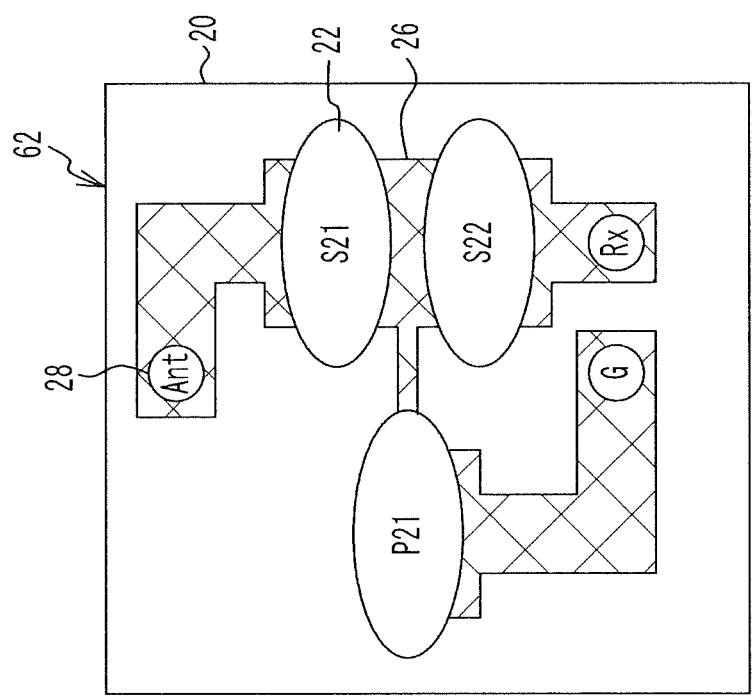

FIG. 13A and FIG. 13B are plan views of substrates in a first comparative example. FIG. 13A is a plan view of the substrate 10, and FIG. 13B is a plan view of the substrate 20 as transparently viewed from above. As illustrated in FIG. 13A and FIG. 13B, in the first comparative example, the penetrating electrodes 15 do not overlap with the sealing portion in the periphery of the substrate 10. Thus, the areas of the substrates 10 and 20 increase by the areas of the penetrating electrodes 15 and the pads. In addition, the distance L1 between the penetrating electrodes 15 for the transmit terminal Tx and the receive terminal Rx is short. Thus, the isolation characteristic between the transmit terminal Tx and the receive terminal Rx deteriorates. For example, signals in the receive band input to the transmit terminal Tx leak to the receive terminal Rx.

In the first embodiment and the variations thereof, as illustrated in FIG. 1A and FIG. 1B, the acoustic wave resonator 12 (an acoustic wave element) is located on the upper surface (a first surface) of the substrate 10 (a first substrate). The wiring line 16, the metal layer 37a, and the penetrating electrode 15 form a wiring portion, and the wiring portion electrically connects the acoustic wave resonator 12 and the terminal 14a (a metal portion) located on the lower surface (a second surface opposite from the first surface) of the substrate 10 through the through hole (the through hole in which the penetrating electrode 15 and the metal layer 37a are formed) penetrating through the substrate 10. The sealing portion 30 is located on the upper surface of the substrate 10 so as to surround the acoustic wave resonator 12, overlaps with at least a part of the through hole (i.e., the penetrating electrode 15 and the metal layer 37a) in plan view, and seals the acoustic wave resonator 12 in the air gap 25. As described above, since the sealing portion 30 overlaps with the through hole, the area of the substrate 10 is reduced. Therefore, the size of the acoustic wave device is reduced.

Since the penetrating electrodes 15 and 15a can be located in the periphery of the substrate 10 in which the sealing portion 30 is located, the number of the penetrating electrodes 15 and 15a can be increased.

As in the first embodiment and the first and second variations thereof, when the sealing portion 30 is a metal sealing portion, the insulating film 32 (a first insulating film) is located between the sealing portion 30 and the wiring line 16, and insulates the sealing portion 30 and the wiring line 16 from each other. Therefore, the wiring portion is used as a signal wiring.

The substrate 10 includes the support substrate 10a and the piezoelectric substrate 11 bonded on the support substrate 10a. The ring-shaped metal layer 37 surrounds the acoustic wave resonator 12, is located on the support substrate 10a in the region in which the piezoelectric substrate 11 is removed, and is bonded with the sealing portion 30. The through hole penetrates through the ring-shaped metal layer 37. The piezoelectric substrate 11a is located between the through hole (i.e., the metal layer 37a) and the ring-shaped metal layer 37. This structure allows the wiring portion and the ring-shaped metal layer 37 to be insulated from each other even when the ring-shaped metal layer 37 is provided.

As in the first embodiment and the second variation thereof, the ring-shaped metal layer 37 is located so as to surround the through hole (i.e., the metal layer 37a) in plan view while the piezoelectric substrate 11a is located between the ring-shaped metal layer 37 and the through hole in plan view. The wiring line 16 and the ring-shaped metal layer 37 overlap in the thickness direction of the substrate 10. The insulating film 17a (a second insulating film) is located between the wiring line 16 and the ring-shaped metal layer 37 in the region in which the wiring line 16 and the ring-shaped metal layer 37 overlap, and insulates the wiring line 16 and the ring-shaped metal layer 37 from each other. This structure allows the wiring line 16 and the ring-shaped metal layer 37 to be insulated from each other even when the wiring line 16 and the ring-shaped metal layer 37 overlap.

The penetrating electrode 15a penetrates through the support substrate 10a, and electrically connects the ring-shaped metal layer 37 and the lower surface of the support substrate 10a. The sealing portion 30 is electrically connected to the ring-shaped metal layer 37. This structure allows a ground potential to be supplied to the sealing portion 30 through the penetrating electrode 15a. Since the wiring line 16 and the metal layer 37a are covered with the sealing portion 30 and the ring-shaped metal layer 37, the areas of coupling between the wiring line 16 and other wiring lines and between the metal layer 37a and other wiring lines are reduced.

The sealing portion 30 is a solder sealing portion. The bonding layer 34 is located on the insulating film 32 and the ring-shaped metal layer 37, is electrically connected to the ring-shaped metal layer 37 in the region where the insulating film 32 is not located, and is bonded with the sealing portion 30. The region where the sealing portion 30 and the bonding layer 34 are bonded overlaps with at least a part of the metal layer 37a in the thickness direction of the substrate 10. Thus, the sealing portion 30 made of solder can be bonded on the substrate 10.

As in the first embodiment and the first variation thereof, the substrate 20 (a second substrate) faces the substrate 10 across the air gap 25. The sealing portion 30 is located so as to surround the substrate 20. The lid 36 is located on the sealing portion 30 and the substrate 20. This structure allows the substrate 20 to be sealed by the lid 36 and the sealing portion.

As illustrated in FIG. 3 through AG. 4B, the transmit filter 60 (a first filter) is electrically connected between the common terminal Ant and the transmit terminal Tx (a first terminal). The receive filter 62 (a second filter) is electrically connected between the common terminal Ant and the receive terminal Rx (a second terminal). At least one of the transmit filter 60 and the receive filter 62 includes the acoustic wave resonator 12. As described above, the acoustic wave device can be configured to be a multiplexer. A case where the transmit filter 60 and the receive filter 62 are ladder-type filters have been described, but the transmit filter 60 and/or the receive filter 62 may be a multimode type filter. A case where the first filter and the second filter are the transmit filter and the receive filter have been described, but both the first filter and the second filter may be transmit filters, or receive filters. A case where the multiplexer is a duplexer has been described, but the multiplexer may be a triplexer or a quadplexer.

The transmit terminal Tx and the receive terminal Rx are located on the lower surface of the substrate 10. As illustrated in FIG. 4A, the through hole (the metal layer 37a) includes a first through hole coupled to the transmit terminal Tx and a second through hole coupled to the receive terminal Rx. The first through hole is located in a first side portion of a pair of side portions of the substrate 10, the pair of side portions facing each other. The second through hole is located in a second side portion of the pair of side portions. This structure increases the distance between the transmit terminal Tx and the receive terminal Rx. Thus, the isolation characteristic is improved.

The lid 36 is located on the sealing portion 30. The lid 36 and the sealing portion 30 seal the acoustic wave resonator 12 in the air gap 25. The lid 36 may not be necessarily provided, and the acoustic wave resonator 12 may be sealed in the air gap 25 by the sealing portion 30.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first substrate that has a first surface and a second surface, the second surface being an opposite surface of the first substrate from the first surface;
   an acoustic wave element that is located on the first surface;
   a wiring portion that electrically connects the acoustic wave element and a metal portion through a through hole, the metal portion being located on the second surface, the through hole penetrating through the first substrate;
   a metal sealing portion that is located on the first surface so as to surround the acoustic wave element, overlaps with at least a part of the through hole in plan view, and seals the acoustic wave element in an air gap;
   a first insulating film that is located between the metal sealing portion and the wiring portion, and insulates the metal sealing portion and the wiring portion from each other, wherein
   the first substrate includes a support substrate having the second surface and a piezoelectric substrate having the first surface, the piezoelectric substrate being bonded on the support substrate,
   the acoustic wave device further comprises a ring-shaped metal layer, the ring-shaped metal layer surrounding the acoustic wave element and located on the support substrate in a region where the piezoelectric substrate is removed, the metal sealing portion being bonded to the ring-shaped metal layer, the through hole penetrates through the ring-shaped metal layer, and the piezoelectric substrate is located between the through hole and the ring-shaped metal layer.

2. The acoustic wave device according to claim 1, further comprising:
a first filter electrically connected between a common terminal and a first terminal; and
a second filter electrically connected between the common terminal and a second terminal, wherein
at least one of the first filter and the second filter includes the acoustic wave element, and
the metal portion comprises the common terminal, the first terminal, and the second terminal.

3. The acoustic wave device according to claim 2, wherein
the first terminal and the second terminal are located on the second surface,
a first through hole that is the through hole is coupled to the first terminal and a second through hole is coupled to the second terminal,
the first through hole is located in a first side portion of a pair of side portions of the first substrate, the pair of side portions facing each other, and
the second through hole is located in a second side portion of the pair of side portions.

4. The acoustic wave device according to claim 1, wherein
the ring-shaped metal layer is located so as to surround the through hole in plan view, the piezoelectric substrate being located between the ring-shaped metal layer and the through hole in plan view,
the wiring portion and the ring-shaped metal layer overlap in a thickness direction of the first substrate, and
the acoustic wave device further comprises a second insulating film that is located between the wiring portion and the ring-shaped metal layer in a region where the wiring portion and the ring-shaped metal layer overlap, the second insulating film insulating the wiring portion and the ring-shaped metal layer from each other.

5. The acoustic wave device according to claim 1, further comprising
a penetrating electrode that penetrates through the support substrate, and electrically connects the ring-shaped metal layer and the second surface,
wherein the metal sealing portion is electrically connected to the ring-shaped metal layer.

6. The acoustic wave device according to claim 1, further comprising
a bonding layer that is located on the first insulating film and the ring-shaped metal layer and is electrically connected to the ring-shaped metal layer in a region where the first insulating film is not located, the bonding layer being bonded with the sealing portion, wherein
the metal sealing portion is a solder sealing portion, and
a region where the metal sealing portion and the bonded layer are bonded overlaps with at least a part of the through hole in a thickness direction of the first substrate.

7. The acoustic wave device according to claim 1, further comprising
a second substrate that faces the first substrate across the air gap,
wherein the metal sealing portion is located so as to surround the second substrate.

8. The acoustic wave device according to claim 1, further comprising
a lid that is located on the sealing portion, the lid and the metal sealing portion sealing the acoustic wave element in the air gap.

* * * * *